(12) United States Patent
Newton et al.

(10) Patent No.: US 6,738,600 B1
(45) Date of Patent: May 18, 2004

(54) CERAMIC MICROELECTROMECHANICAL STRUCTURE

(75) Inventors: Charles M. Newton, Palm Bay, FL (US); Raymond C. Rumpf, Melbourne, FL (US); Carol Gamlen, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 388 days.

(21) Appl. No.: 09/632,701

(22) Filed: Aug. 4, 2000

(51) Int. Cl.[7] ................................. H04B 3/38
(52) U.S. Cl. .................... 455/66.1; 455/74; 455/344; 430/311; 333/204; 428/210; 428/213; 438/48
(58) Field of Search ............................. 438/48, 58, 59, 438/62, 63, 67; 430/311, 313, 317; 428/209, 210, 213, 216; 333/133, 186, 203, 204, 81 A; 455/66.1, 74, 344, 41.2, 151.2

(56) References Cited

U.S. PATENT DOCUMENTS

| | | | | |
|---|---|---|---|---|
| 5,024,372 A | * | 6/1991 | Altman et al. | 228/180.22 |
| 5,121,089 A | | 6/1992 | Larson | 333/107 |
| 5,326,671 A | * | 7/1994 | Brown et al. | 430/311 |
| 5,498,905 A | | 3/1996 | Young | 257/700 |
| 5,513,382 A | * | 4/1996 | Agahi-Kesheh et al. | 455/83 |
| 5,611,876 A | | 3/1997 | Newton et al. | 156/89 |
| 5,619,061 A | * | 4/1997 | Goldsmith et al. | 257/528 |
| 5,638,946 A | | 6/1997 | Zavracky | 200/181 |
| 5,661,647 A | | 8/1997 | Washburn et al. | 363/147 |
| 5,665,249 A | | 9/1997 | Burke et al. | 216/2 |
| 5,708,570 A | | 1/1998 | Pollinski, Sr. | 361/762 |
| 5,856,068 A | * | 1/1999 | Magera et al. | 430/312 |
| 5,866,240 A | * | 2/1999 | Prabhu et al. | 428/210 |
| 5,919,325 A | | 7/1999 | Goebel et al. | 156/89.16 |
| 5,920,244 A | * | 7/1999 | Kobayashi et al. | 333/219 |
| 5,963,856 A | | 10/1999 | Kim | 455/307 |
| 5,969,848 A | | 10/1999 | Lee et al. | 359/298 |
| 5,982,250 A | | 11/1999 | Hung et al. | 333/26 |
| 6,020,564 A | | 2/2000 | Wang et al. | 200/181 |
| 6,046,659 A | | 4/2000 | Loo et al. | 333/262 |
| 6,127,744 A | * | 10/2000 | Streeter et al. | 307/125 |
| 6,160,230 A | * | 12/2000 | McMillan et al. | 200/181 |
| 6,229,098 B1 | * | 5/2001 | Dunn et al. | 174/260 |
| 6,232,042 B1 | * | 5/2001 | Dunn et al. | 430/315 |
| 6,232,251 B1 | * | 5/2001 | Terashi et al. | 501/5 |
| 6,391,675 B1 | * | 5/2002 | Ehmke et al. | 438/53 |
| 6,580,337 B1 | * | 6/2003 | Valas | 333/105 |

* cited by examiner

*Primary Examiner*—Cong Van Tran
(74) *Attorney, Agent, or Firm*—Allen, Dyer, Doppelt, Milbrath & Gilchrist, P.A.

(57) ABSTRACT

A microelectromechanical structure and method is disclosed. A ceramic substrate preferably is formed from low temperature co-fired ceramic sheets. A low loss photodefinable dielectric planarizing layer is formed over one surface of the ceramic substrate. This layer can be a sacrificial layer or a subsequent sacrificial layer added. A photodefined conductor is printed over the low loss dielectric planarizing layer and formed with the sacrificial layer into a structural circuit component. In one aspect of the invention, a switch is formed with a biasing actuator and deflectable member formed over the biasing actuator and moveable into open and closed circuit positions.

24 Claims, 3 Drawing Sheets

CERAMIC MICROELECTROMECHANICAL STRUCTURE

FIELD OF THE INVENTION

This invention relates to microelectromechanical structures, and more particularly, this invention relates to microelectromechanical structures using ceramic substrates.

BACKGROUND OF THE INVENTION

Thick film materials have been used for packaging applications in the microelectronics industry. Their acceptance in the industry, however, has not been widespread because thin film technology using silicon photolithographic processes has been better adapted for high performance requirements, such as microwave and other radio frequency applications. The thick film substrates also have poor geometrical resolution and a very high dielectric constant. Via formation has not been adequate, and typically greater than 200 microns.

In recent microelectronic packaging designs, there has been a greater need for high performance materials and processes that allow finer geometries and circuit layout without sacrificing performance. As a result, for critical applications as in the fabrication of microstrip transmission lines and similar structures, thin film silicon and other related thin film technology has been used instead of thick film processing technology.

Three major approaches for fabricating microstrip transmission lines and similar structures have been thin film, thick film and polymer technology, i.e., soft board. These technologies have some drawbacks with regard to current and future applications. Thin film technology has become established for use with microwave circuit and component technology, but it is expensive because of its typical use of sputter coating, which is also wasteful in material. Additionally, an adhesion layer is required between a sputtered line and a substrate to create an insulator at the interface with the substrate, where current flows in the microstrip line. Because a thin film material follows the surface finish of a substrate, losses increase, which are significant with increasing frequency. Thus, an expensive 99.6% polished alumina has been used for thin film applications, and increases even more the cost of a thin film microwave or radio frequency circuit. Even then, this type of circuit will suffer losses due to the presence of the adhesion layer.

Polymer technology is used increasingly for microwave circuits because it has a lower cost. These lower cost polymer materials, however, are high in dielectric loss and have limited component geometries and some environmental limitations. Some of the more advanced materials overcome these drawbacks, but are even more expensive. Even though geometrical constraints can be overcome by the use of a build-up technology, the costs increase.

Thick film technology, such as the well known green tape technology and other similar materials technology, is little used at the present for microwave circuit applications and similar radio frequency applications, even though it is an inexpensive medium. Thick film circuit technology can resolve many microstrip lines, but it occurs with poor edge definition and a relatively rough conductive surface. For some components, such as an edge coupled filter, it does not produce the fine gaps required for the design. Also, the dielectric materials generally are high in dielectric constant (seven or greater) and have a dielectric loss of 0.01, i.e., about 1%. The low cost of the thick film materials, however, would make them advantageous for use in microelectromechanical structures used with radio frequency applications, if a means could be found to overcome the drawbacks as indicated above.

SUMMARY OF THE INVENTION

The present invention is advantageous and now allows the use of thick film materials for use in microelectromechanical structures used in radio frequency and similar microwave applications. A microelectromechanical structure of the present invention includes a ceramic substrate formed preferably as a low temperature co-fired ceramic substrate. A low loss photodefinable dielectric planarizing layer is formed over the low temperature co-fired ceramic substrate and could be a sacrificial layer. Alternately, a sacrificial layer could be formed over the planarizing layer and could be a material that could be etched. A photodefined conductor is printed over the low loss dielectric planarizing layer or sacrificial layer and formed together with the sacrificial layer into a structural circuit component preferably for use with radio frequency applications. In one aspect of the present invention, the photodefined conductor is formed as a switch. A biasing actuator is formed and a deflectable member is formed over the biasing actuator and movable into open and closed circuit positions. This deflectable member can be formed as a cantilever beam or formed as a suspended beam, depending on the application.

In still another aspect of the present invention, the photodefined conductor can include an input signal line and output signal line that transfers current when the switch is in the closed, circuit position. The photodefined conductor comprises a thick film conductor and the photodefinable dielectric planarizing layer is preferably formed from a borosilicate based, thick film dielectric material. It typically has a dielectric constant of about 3.8 to about 4.2, and on the average is about 3.9. It also has a loss factor of about 0.01%, i.e., 0.0001. The ceramic substrate is preferably formed from ceramic sheets that are stacked and co-fired together. These sheets can have printed circuit connections and vias extending along various surfaces of the layers for interconnection to various circuit components, as required by those skilled in the art.

A radio frequency switch circuit is also disclosed and includes a radio frequency input, control input, radio frequency output and the microelectromechanical switch of the present invention connected to the radio frequency input and output, and the control input. The control input can include a transistor. The radio frequency input can include a coil and capacitor combination as required, and a positive terminal connection. The control input is typically connected to base and the radio frequency output includes a capacitor as required in some instances.

A method of forming a microelectromechanical structure is also disclosed and comprises the step of forming a ceramic substrate and forming a low loss photodefinable dielectric planarizing layer over a surface of the low temperature co-fired ceramic substrate. A structural circuit component is formed on the photodefinable dielectric planarizing layer from a sacrificial layer and a photodefined conductor preferably for use in radio frequency applications. The ceramic substrate can be formed from ceramic sheets that are stacked and co-fired together. The photodefined conductor is formed with the sacrificial layer as a switch having a biasing actuator and deflectable member formed over the biasing actuator and moveable into open and closed circuit positions.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
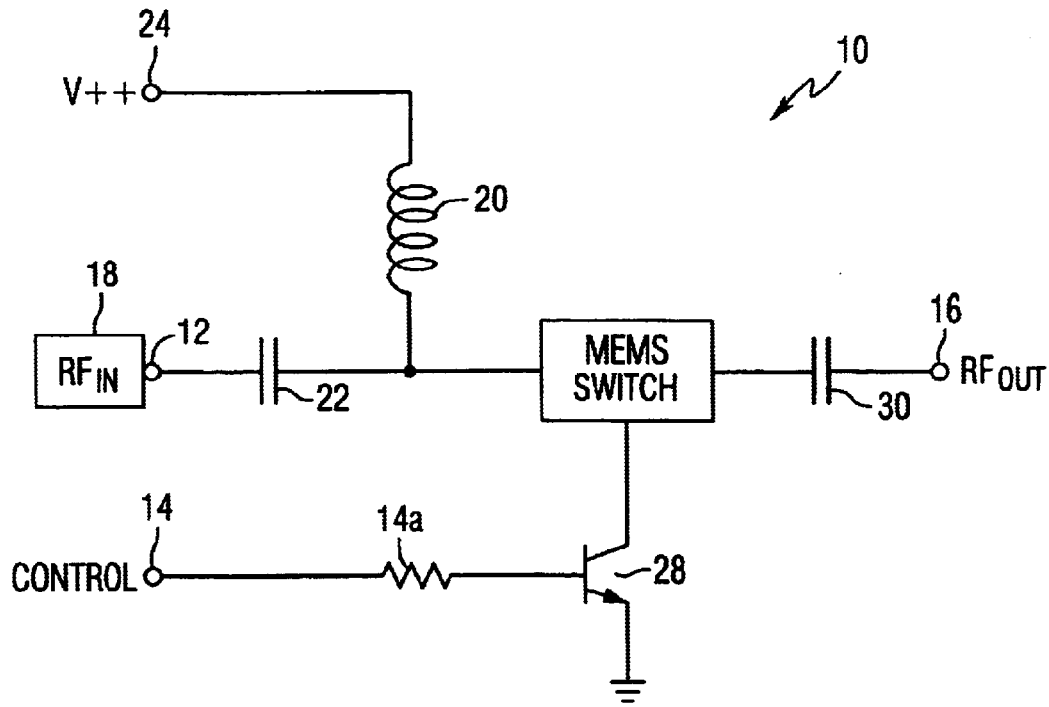
FIG. 1 is a general schematic circuit diagram of the radio frequency switch circuit of the present invention, showing basic components and a microelectromechanical switch.
Figure 1A:
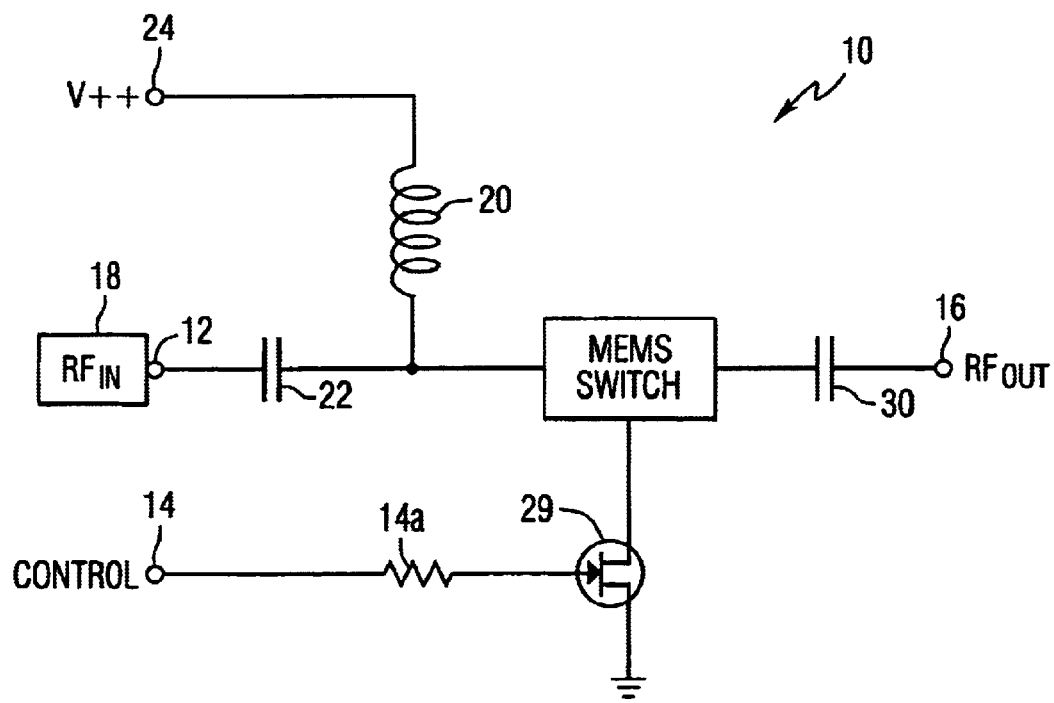
FIG. 1A is a view similar to FIG. 1, but showing the structuring using a FET.

The present invention is advantageous and allows the formation of microelectromechanical structures for radio frequency applications, including microwave circuits, using a ceramic substrate such as a low temperature co-fired ceramic (LTCC) substrate that heretofore has not been used because of its lack of fabrication precision and accuracy in impedance control and good definition of coupler and filter performance, and high dielectric constants. The thick film technology also has suffered poor edge definition and a relatively rough conductive surface. The dielectric constant is also high, about seven or greater, and the dielectric loss of 0.01 has been found unacceptable. The present invention uses thick film technology to form a microelectromechanical structure that is acceptable for radio frequency applications, such as a radio frequency switch circuit 10 as shown in FIG. 1. The circuit includes radio frequency input 12, controls input 14 and radio frequency output 16. The radio frequency input 12 is connected to a radio frequency signal source 18, including an inductor 20, capacitor 22 and a positive voltage terminal 24, as known to those skilled in the art. The control input 14 is connected to a bipolar transistor 28 or any switching device to provide on/off operation of the microelectromechanical switch, and would typically be connected to a microprocessor or other control circuit for operation of the switch circuit 10. The control 14 includes a biasing resistor 14a, as known to those skilled in the art. The radio frequency output includes a capacitor 30 and other components that may be necessary, as known to those skilled in the art. FIG. 1A shows a circuit similar to what is shown in FIG. 1. In FIG. 1A, field effect transistor 29 is used instead of the bipolar transistor 28.

Figure 2:
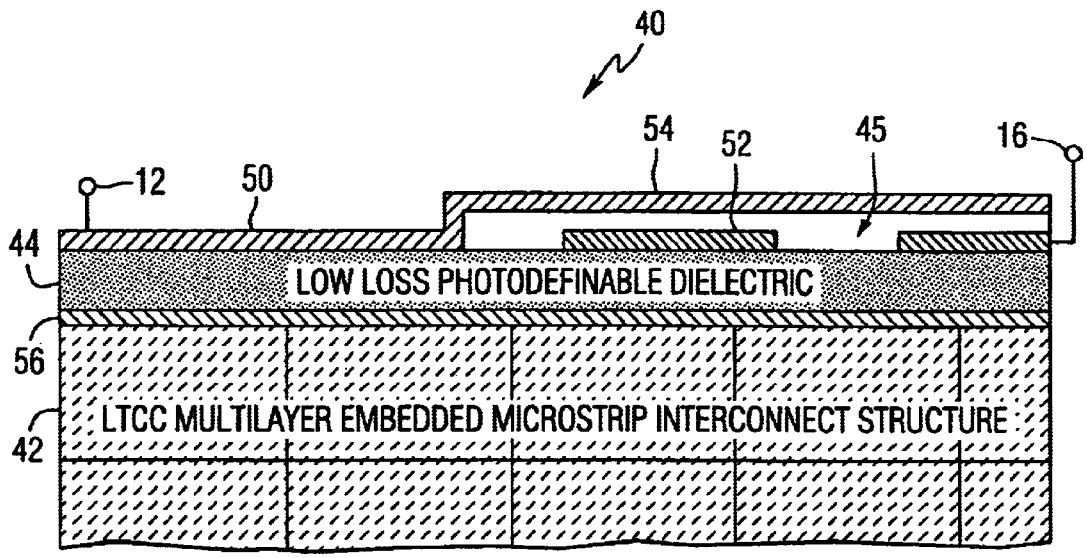
FIG. 2 is a fragmentary, sectional view of a microelectromechanical switch of the present invention using a cantilever beam.

FIG. 2 illustrates a sectional view of a microelectromechanical structure 40 formed as a radio frequency switch in the illustrated embodiment. A low temperature, co-fired ceramic (LTCC) substrate base layer 42 is formed by the processing of ceramic sheets as known to those skilled in the art. The ceramic tape and similar technology allows the use of multilayer circuits as is well known. Different layers can have different printed circuits and interconnecting vias. As is known to those skilled in the art, the multilayer circuit/low temperature co-fired ceramics are formed by the known raw materials to form a ceramic material, and then forming a slurry and tape casting through appropriate processing machinery. Different sheets are then blanked and any vias punched and filled with conductive material to be used as interconnects. Individual circuit layers are screen printed with the appropriate circuit lines and then laminated together, cut and co-fired to terminate. Electroplating is used as necessary. They have a three dimensional design with a controlled impedance and environmental stability. As noted before, however, these structures have a high dielectric constant and high loss.

In accordance with the present invention, a low loss, photodefinable dielectric planarizing layer 44 is formed over the low temperature co-fired ceramic substrate 42. This layer can be a sacrificial layer that is removed by etching or other removal techniques. Only selected portions are removed to form the MEMS structure. Alternately, a sacrificial layer 45 could be formed over the layer 44, and is selectively removed to form the MEMS structure. In one aspect of the invention, the planarizing layer 44 acts as part of the sacrificial layer such that a portion of the planarizing layer is removed. Other materials could be used as a sacrificial layer, including other known photosensitive materials and even low temperature glass.

This low loss, photodefinable dielectric planarizing layer 44 is formed in one aspect from a preferred borosilicate thick film dielectric material, such as the KQ115/150 photoimagable dielectric material manufactured and sold by Heraeus, Inc., Cermalloy Division of Germany and Pennsylvania. This type of material has excellent microwave performance to at least 80 GHZ, low dielectric loss of about 0.01% (10-4), and a low dielectric constant of between about 3.8 to 4.2 (about 3.9 typically on the average). Conductors have a smooth surface and precise edges with excellent edge acuity of typically about one micron. Vias can be formed with dimensions of about 50 microns, or even less as compared to LTCC layers that have via definitions approaching about 20 microns on the average. This dielectric planarizing layer can be patterned using a photomask and collimated light source and a pattern can be developed by a simple spray washing process and fired in a thick film furnace. The borosilicate material used can have a firing temperature in the 870° C. range while preserving the electrical performance inherent in the material. The firing cycle is typically about two hours.

This dielectric can be screened using normal screen printing parameters, and if ink is sheered through the screen, it can be printed with a squeegee speed of 8–10 inches per second. Any ink can be a low viscosity, low solid material having a smooth, thin, wet layer. A 325 mesh, 0.5 mil, 1.1 mil wire screen has been used. When this dielectric is printed, it can be brought to a mask aligner and imaged in a wet state, using a small stand-off between a wet dielectric and the mask. This form of dielectric, in one aspect, is a photonegative paste. Any area that is blacked out on a photomask would not be exposed to an ultraviolet light and will remain wet while the area that is exposed to the ultraviolet light will polymerize and remain behind after developing.

After exposure to ultraviolet light, any parts can be forwarded to a spray booth where they can be sprayed with IPA to remove wet dielectric. Typically there can be an exposure of about 120 mj/cm$^2$ (around three seconds) using a nitrogen flow over the wet dielectric, while exposed to an ultraviolet light source. It is possible to use multilayer dielectrics having a fired thickness of between about 35 and 45 microns.

As shown in FIG. 2, a photodefined conductor 50 is printed over the low loss dielectric planarizing layer 44 and formed with the sacrificial layer 45 into a structural circuit component for use with radio frequency applications, which as shown in FIG. 2, is formed as a switch having a biasing actuator 52 and deflectable member 54 formed over the biasing actuator and moveable into open and closed circuit positions. The photodefined conductor material could be used as a ground plane layer 56 or other conductor layer formed between the low temperature co-fired ceramic substrate 42 and the low loss, photodefinable dielectric planarizing layer 44.

The photodefined conductor is printed over the low loss dielectric planarizing layer 56 (and any additional sacrificial layer, if used), and is a photoengraveable conductor material, such as the Heraeus KQ 500 material, which is a photoengraveable gold conductor having a thick film gold using small, tightly distributed spherical particles to form a very smooth fired surface that allows easy photoresisting and etching. Although gold is used with the KQ 500 material, other materials such as silver (AG) are also photodefinable and produce circuit lines with smooth edges at the limits of LTCC photo processing, i.e., line resolution below 20 microns. This is an order of magnitude of about ten times improvement over typical low temperature co-fired ceramic geometry definition and can have an electrical conductivity that approaches bulk metal values and high density firing, such as 2.6 miliohm, 96% of bulk silver, yielding a high Q conductor.

For purposes of description and example only, the photo processing of a thick film, gold photodefined KQ conductor material is set forth below. The other photodefined materials known to those skilled in the art can also be used. The following description provides an example of the type of materials processing used.

The gold conductor can be printed using conventional thick film printing, and fired in a standard 850° C. profile. A paste material can be used and is formed as a low solids material that is thinned. The paste can be printed either in ground plane patterns or only in the areas where an actual circuit trace will be etched. For example, a ground plane layer 56 could be formed as noted above with the paste, followed by the application of the planarizing layer 44. The optimum backlit density can be achieved with two print, dry, fire layers at about 150° C. for about ten minutes. A 400 mesh, 0.3 mil emulsion, 0.9 mil wire screen would yield a fired film thickness for two layers of between about 4 and 5 microns and more layers could be built, and measured using x-ray analysis.

After firing, the gold is photoresisted, such as using spun on liquid resist, roller coating, spraying and dry film resist, as known to those skilled in the art. For this KQ process, a liquid resist has been found adequate using a standard spin coater where a liquid resist is spun onto the fired gold. Because the gold thickness can be about 4—4 microns, the same thickness of resist is desired. In this described KQ process, a dispense speed of about 500 RPM for 10 seconds can be used and a spread speed of about 2800 RPM for 20 seconds can be adequate under certain operating parameters. To avoid the meniscus on the edge of the substrate, the gold print can be pulled back from the edge. After spinning, the parts can be soft baked in a box oven for 200 seconds at 110° C., with these parameters varying based on the size and the thermal mass of the part.

Patterning can be done using a mask aligner and a UV light source with some sort of alignment system. For the KQ gold, the photoresist can be contact patterned. The dielectric is patterned in the wet state so off contact alignment is necessary. A collimated UV source is usually required to image small geometries. For this KQ gold process described, a six micron etch factor occurs on all sides of a pattern for a 50 micron conductor, and a 62 micron line can be imaged on the mask. For most complex circuits, a glass photomask will yield better geometry control than a photo mylar. The resisted substrate can be placed on the aligner platen. The photomask is lowered over the part, the part is aligned, and the exposed to the ultraviolet light. The KQ process uses a 1000 watt bulb and the photoresist is exposed to 400 mj/cm$^2$. A photometer can be used to monitor bulb output. UV light can be very hazardous such that eye and skin protection should be worn.

The parts are then developed using a potassium based, buffered solution, and submerged in a tank containing the solution for two minutes. There are also spray developers and spin developers. After developing, the photoresist protects the gold pattern when etching remains. In the current process, there is no hard bake step, although for very fine geometries (less than one micron) this may be necessary. The resisted parts can be inspected using florescene microspray to detect resist defects. If defects are found, the resist can be stripped and the gold reused. The photoresist can be removed using liquid stripping compounds and then rinsing in water, as known to those skilled in the art.

Etching can occur using batch spray and belt etchers. A solution of potassium iodide/iodine can be used to etch the gold. The longer times and higher bath temperatures allow more gold to be removed during etching. For standard thicknesses, between 4 and 5 minutes is normal to remove any unprotected gold and achieve good line definition. The amount of gold in the bath is chemically monitored and the gold is sent to a refiner when the bath is saturated. After etching, the photoresist is stripped as noted above.

Although this description is pertaining to the KQ materials as described above, other materials known to those skilled in the art can be used. The process flow also can differ depending on the formed structure.

Figure 3:
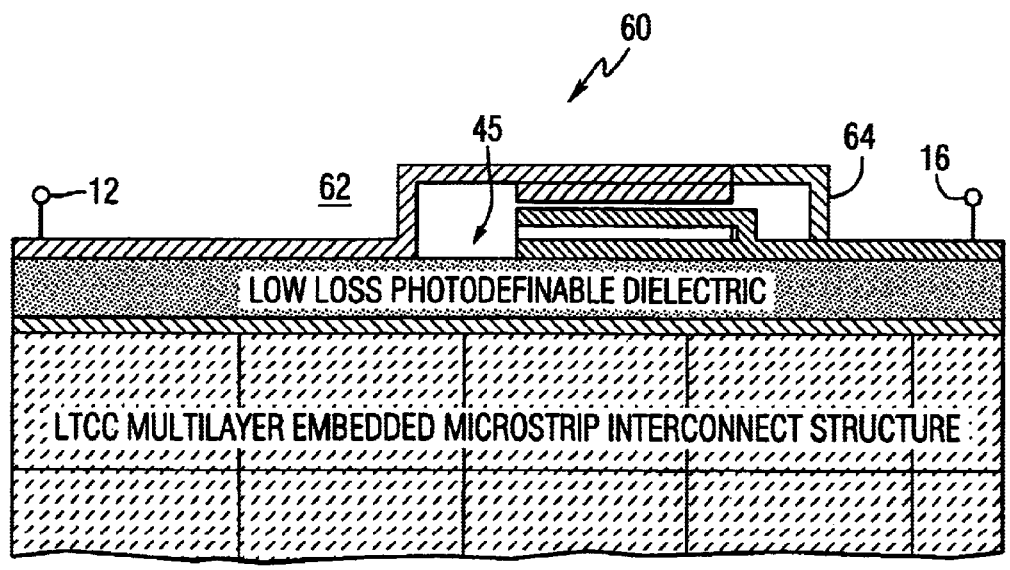
FIG. 3 is a fragmentary, sectional view of a microelectromechanical switch using a suspended beam.

FIG. 3 shows another microelectromechanical structure 60 formed as a suspended beam switch 62 where there is no cantilever, but the actuator is positioned in a middle structure between supports 64. The actuator 52 forces the center down to complete a switch connection similar to what has been described before with reference to FIG. 2.

Figure 4:
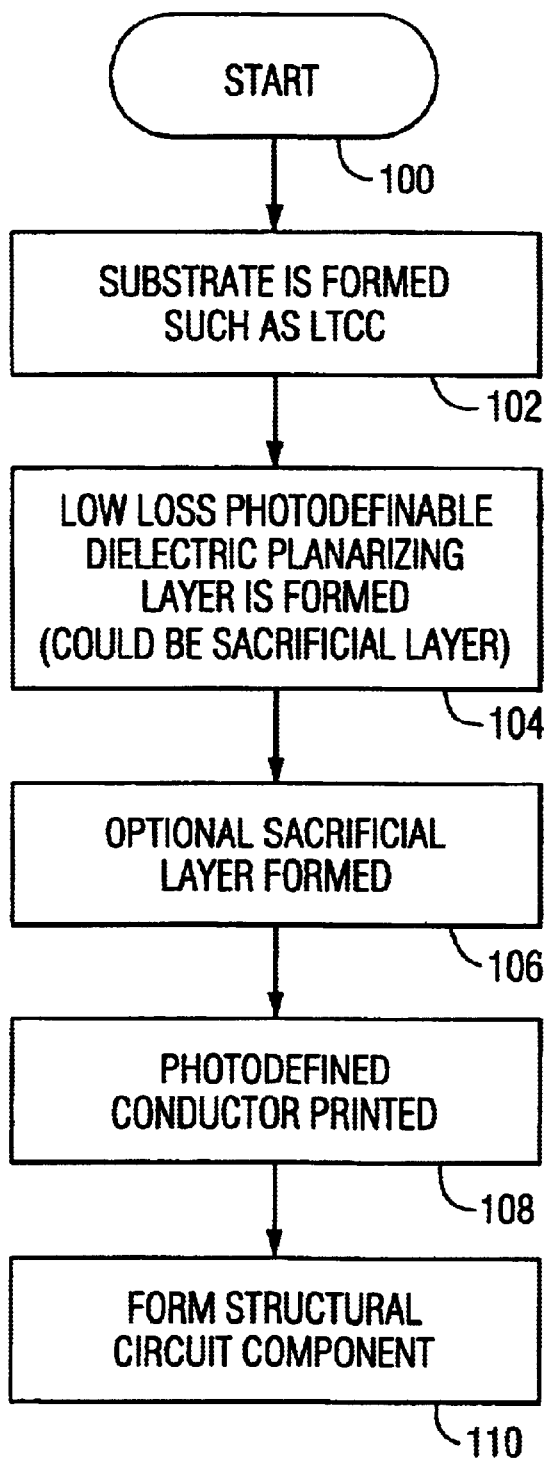
FIG. 4 is a flow chart illustrating the basic method of forming a microelectromechanical structure of the present invention.

FIG. 4 shows a basic flow chart setting forth the method of forming a microelectromechanical structure of the present invention.

The processing starts with the end use to be defined as a microelectromechanical switch (block 100). A preferably low temperature co-fired ceramic substrate is formed (block 102). A low loss photodefinable dielectric planarizing layer is formed over the surface of the low temperature co-fired ceramic substrate (block 104). This layer could be a sacrificial layer component. An optional sacrificial layer can be formed (block 106). A photodefined conductor for preferable use in radio frequency applications (block 108) is printed. A structural circuit component is formed by removal technology, such as photolithography and photoengraveable techniques (block 110).

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. A microelectromechanical structure used for radio frequency applications comprising:
   a multilayer ceramic substrate having embedded microstrip and interconnect structures among different layers;
   a low loss photodefinable dielectric planarizing layer formed substantially over the ceramic substrate; and
   a photodefined conductor printed in a position over the low loss dielectric planarizing layer and formed into a microelectromechanical (MEMS) switch used at radio frequencies.

2. A microelectromechanical structure according to claim 1, and further comprising a sacrificial layer over said low loss photodefinable dielectric planarizing layer and formed with the photodefined conductor into a structural circuit component.

3. A microelectromechanical structure according to claim 1, wherein said low loss photodefinable dielectric planarizing layer is formed as a sacrificial layer.

4. A microelectromechanical structure according to claim 1, wherein said switch further comprises a deflectable member that is movable into open and closed circuit positions.

5. A microelectromechanical structure according to claim 4, wherein said deflectable member is formed as a cantilever beam.

6. A microelectromechanical structure according to claim 4, wherein said deflectable member is formed as a suspended beam.

7. A microelectromechanical structure according to claim 1, wherein said photodefined conductor further comprises an input signal line and output signal line that transfer current.

8. A microelectromechanical structure according to claim 1, wherein said photodefined conductor comprises a thick film conductor.

9. A microelectromechanical structure according to claim 1, wherein said low loss photodefinable dielectric planarizing layer is formed from a borosilicate based thick film dielectric material.

10. A microelectromechanical structure according to claim 1, wherein said photodefinable dielectric planarizing layer has a dielectric constant of about 3.8 to about 4.2.

11. A microelectromechanical structure according to claim 1, wherein said photodefinable dielectric planarizing layer has a loss factor of about 0.01%.

12. A microelectromechanical according to claim 1, wherein said ceramic substrate is formed from ceramic sheets that are stacked and co-fired together.

13. A method of forming a microelectromechanical structure used for radio frequency applications comprising the steps of:
    forming a multilayer ceramic substrate having embedded microstrip and interconnect structures among different layers;
    forming a low loss photodefinable dielectric planarizing layer substantially over the ceramic substrate; and
    forming a microelectromechanical (MEM) switch from at least the photodefined conductor used at radio frequencies.

14. A method according to claim 13, and further comprising the step of forming the planarizing layer as a sacrificial layer and removing part of the planarizing layer to form the structural component.

15. A method according to claim 13, and further comprising the step of forming a sacrificial layer over the planarizing layer that is at least partially removed to form the structural component.

16. A method according to claim 13, and further comprising the step of forming the ceramic substrate from ceramic sheets that are stacked and co-fired together.

17. A method according to claim 13, and further comprising the step of forming the switch with a deflectable member and movable into open and closed circuit positions.

18. A method according to claim 17, and further comprising the step of forming the deflectable member as a cantilever beam.

19. A method according to claim 17, and further comprising the step of forming the deflectable member as a suspended beam.

20. A method according to claim 17, and further comprising the step of forming an input signal line and output signal line that transfer current when said switch is in the closed position.

21. A method according to claim 13, and further comprising the step of forming the photodefined conductor member as a thick film conductor.

22. A method according to claim 13, and further comprising the step of forming the low loss photodefinable dielectric planarizing layer as a borosilicate based thick film dielectric material.

23. A method according to claim 13, wherein the photodefinable dielectric planarizing layer has a dielectric constant of about 3.8 to about 4.2.

24. A method according to claim 13, wherein said photodefinable dielectric planarizing layer has a loss factor of about 0.01%.

* * * * *